United States Patent [19]

Gilmore

[11] 4,360,852
[45] Nov. 23, 1982

[54] OVERCURRENT AND OVERTEMPERATURE PROTECTIVE CIRCUIT FOR POWER TRANSISTOR SYSTEM

[75] Inventor: Thomas P. Gilmore, Wauwatosa, Wis.

[73] Assignee: Allis-Chalmers Corporation, Milwaukee, Wis.

[21] Appl. No.: 249,850

[22] Filed: Apr. 1, 1981

[51] Int. Cl.³ .............................................. H02H 3/10
[52] U.S. Cl. ...................................... 361/98; 361/18; 361/106
[58] Field of Search ...................... 361/18, 90, 94, 98, 361/100, 101, 106, 152, 160

[56] References Cited

U.S. PATENT DOCUMENTS

| | | | |
|---|---|---|---|
| 3,449,598 | 6/1969 | Wright | 361/98 X |
| 3,748,569 | 7/1973 | Frank et al. | 361/18 X |
| 3,898,552 | 8/1975 | Baker | 361/98 X |

FOREIGN PATENT DOCUMENTS

| | | | |
|---|---|---|---|
| 2733749 | 2/1979 | Fed. Rep. of Germany | 361/101 |
| 142110 | 6/1980 | Fed. Rep. of Germany | 361/98 |
| 476631 | 1/1976 | U.S.S.R. | 361/98 |

Primary Examiner—Harry E. Moose, Jr.
Attorney, Agent, or Firm—Lee H. Kaiser

[57] ABSTRACT

A power transistor switch is protected against thermal destruction that might be caused by accidental short circuiting of the load being switched by a protective circuit having a base-drive-removing transistor in shunt to the base-emitter junction of the power transistor; an RC circuit including a capacitor in series with a resistor connected across the power transistor with the capacitor coupled across the base-emitter junction of the base-drive-removing transistor; a forward-biased shunting transistor connected across the capacitor; a shunt-removing transistor connected across the base-emitter junction of the shunting transistor; and a turn-on transistor triggerable to the conductive state by a turn-on signal for applying base drive to the power transistor and for forward biasing the shunt removing transistor to thereby turn off the shunting transistor and permit the capacitor to charge. Excessive current flow through the power switch causing it to desaturate results in charging the capacitor and consequent turning on the base-drive-removing transistor to thereby remove base current from the power transistor and turn it off.

8 Claims, 1 Drawing Figure

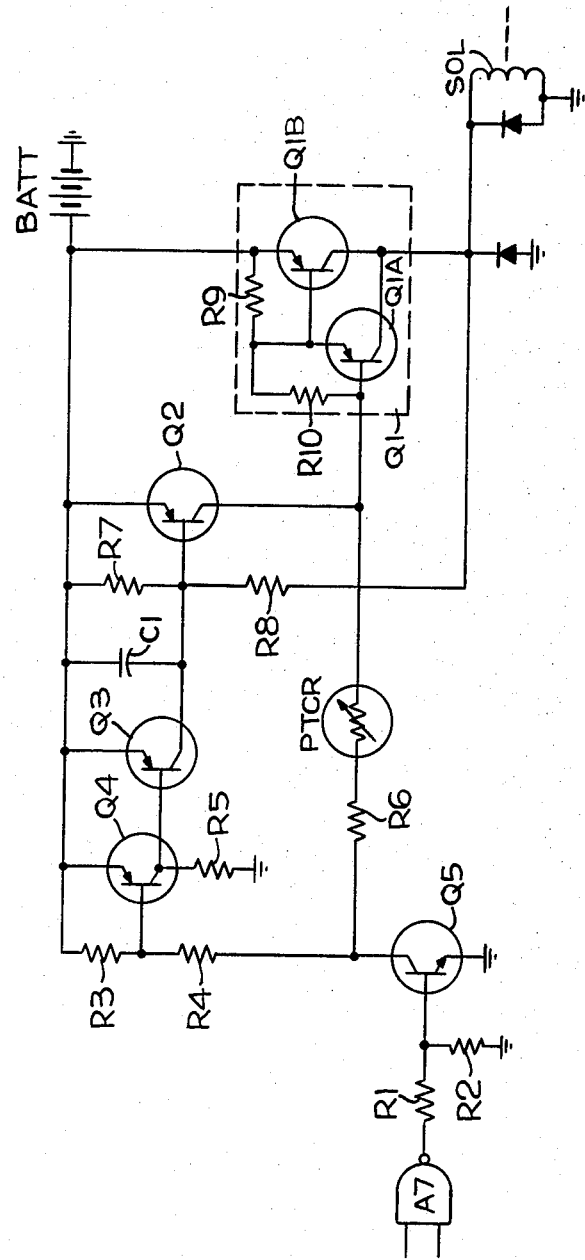

OVERCURRENT AND OVERTEMPERATURE PROTECTIVE CIRCUIT FOR POWER TRANSISTOR SYSTEM

BACKGROUND OF THE INVENTION

This invention relates to overcurrent and overtemperature protection of power transistor switches.

Many power control applications use power transistors as switches. For example, in the data processing area power transistors are used in the switching mode to turn on and off display lights and to activate solenoid drivers used in printers and key punches. Power transistors are also used in the switching mode as solenoid drivers in a wide variety of applications such as combines and other agricultural implements. In the instrumentation area power transistors are operated in the switching mode for all sorts of voltage and current regulated power supplies, and in areas where portable AC is needed, switching mode power transistor circuits convert DC from batteries to AC at desired frequency. In electrically driven vehicles and in electric hand tools, transistors used in the switching mode chop battery current to control energy flow from the battery to the electric motor.

In many such applications of power transistors as switches, a fault condition results in desaturation and excessively high current which causes rapid thermal destruction of the switching transistor. Failure of the power transistor necessitates its replacement before the apparatus can be used. For example, if personnel testing an agricultural combine having solenoid circuits negligently touch a metallic tool to terminals which results in short circuit of the solenoid coil, a fault current of high enough magnitude may flow and cause the driver transistor to come out of saturation and destroy the transistor. As a result, the combine cannot be used until the failed drive transistor is replaced.

In general, fuses do not provide effective protection for such switching transistor because, unless the transistor is of considerably greater current rating than required for the application, the transistor will usually be thermally destroyed before the fuse ruptures. Current threshold sensing circuits are known wherein the switching transistor normally conducts in the saturated condition, and if the switching transistor starts to come out of saturation, feedback through an on-off control circuit gates the base current to the switching transistor off to prevent transistor failure. Base current is gated on again by a trigger pulse at the leading edge of each switching cycle, and the switching transistor remains on as long as it is conducting in the saturated condition. Such a current threshold sensing and conduction limit circuit for motor control is disclosed in U.S. Pat. No. 3,855,520 to F. A. Stich having the same assignee as this invention, but such circuit is too costly and complicated for most power control applications.

OBJECTS OF THE INVENTION

It is an object of the invention to provide an improved overcurrent and overtemperature protection circuit for a power switching transistor which prevents failure of the switching transistor in the event that the load controlled by this transistor is short circuited or its temperature becomes excessive.

It is a further object of the invention to provide an improved protective circuit for a solenoid driver transistor which gates base current off to prevent failure of the transistor if a loose wire, or a tool carelessly handled by testing personnel, short circuits the solenoid coil, thereby permitting immediate use of the apparatus embodying the solenoid after removal of the short circuit without the necessity of replacing the switching transistor as was required in prior art apparatus.

SUMMARY OF THE INVENTION

A power transistor switch is protected against overcurrent and overtemperature by a circuit having a base-drive-removing transistor in shunt to the base-emitter circuit of the power transistor; an RC circuit including a capacitor in series with a resistance connected across the power transistor with the capacitor coupled across the base-emitter junction of the base-drive-removing transistor; a forward-biased shunting transistor connected across the capacitor; and switch turn-on transistor means triggerable to the conductive state by a turn-on signal for applying base drive to the power transistor and for removing forward bias from said shunting transistor so that it turns off and permits the capacitor to charge. Flow of excessive current through the power transistor causing it to desaturate results in charging the capacitor and turning on the base-drive-removing transistor when the capacitor is charged to a predetermined voltage to thereby drain base current from the power transistor to turn it off. A positive temperature coefficient resistor attached to the power transistor is connected in series with the base thereof and increases abruptly in resistance when the power transistor reaches a predetermined temperature to thereby remove base drive from the power transistor so that the capacitor charges to a higher voltage to further remove base drive from and eventually turn off the power transistor.

DETAILED DESCRIPTION

Referring to the drawing, a power transistor Q1 is shown connected as a solenoid driver to switch on and off a load comprising the operating coil SOL of a solenoid which may, for example, constitute an electromagnetic actuator in a control that automatically regulates the height of the header of an agricultural combine. The mechanical linkage actuated by the solenoid is omitted from the drawing. Power transistor Q1 may comprise a Darlington arrangement of two p-n-p transistors Q1A and Q1B in a unitary assembly. One side of solenoid coil SOL is grounded and the other side is coupled to the collector of transistor Q1B whose emitter is connected to the anode of a battery BATT having its cathode grounded.

The emitter-collector junction of a p-n-p base-drive-removing transistor Q2 is connected in shunt to the base-emitter junction of power transistor Q1, and it will be appreciated that base current is drained away from power transistor Q1 when transistor Q2 is in the conductive state. An RC time delay circuit including a capacitor C1 in series with a resistance R8 is connected across the emitter-collector junction of power transistor switch Q1 with capacitor C1 connected across the base-emitter junction of base-drive-removing transistor Q2. A resistance R7 is coupled across capacitor C1 and together with resistance R8 forms a voltage divider across power transistor Q1. A p-n-p shunting transistor Q3 has its emitter-collector junction coupled across capacitor C1 so that C1 is short circuited when Q3 is turned on. The base of Q3 is connected to one side of a resistance R5 whose other side is grounded so that current flows from the anode of battery BATT through the base-emitter junction of Q3 and R5 to ground so that Q3 is forward biased and conducts to thereby short circuit capacitor C1 when power transistor switch Q1 is turned off.

A p-n-p shunt-removing transistor Q4 has its emitter-collector junction connected across the base-emitter junction of shunting transistor Q3 so that turning Q4 on removes forward bias from Q3 to turn it off and thereby permit capacitor C1 to charge. A resistance R3 is connected across the base-emitter junction of shunt-removing transistor Q4.

Switch turn-on transistor means are triggerable by a turn-on signal to the conductive state for removing the forward bias from shunting transistor Q3 and for applying base drive to power transistor Q1 and include shunt-removing transistor Q4 and a n-p-n turn-on transistor Q5 having its emitter grounded and its collector connected through resistances R4 and R6 to the bases of transistors Q4 and Q1 respectively. A positive temperature coefficient resistor PTCR mechanically attached to power transistor Q1 is connected in series with R6 between the base of Q1 and the collector Q5. The base of turn-on transistor Q5 is connected through a resistance R2 to ground and through a resistance R1 to the output of a triggering logic gate shown as a NAND gate A7 whose output is logic 0 voltage when power transistor switch Q1 is turned off. When power transistor switch Q1 is turned off, both inputs to NAND gate A7 are logic 1 voltage so its output is logic 0 voltage, transistors Q1, Q2, and Q4 are off, and Q3 is conducting. In operation, logic 0 voltage may be applied to one of the inputs to NAND gate A7 to turn on power transistor switch Q1, thereby causing A7 to provide a logic 1 voltage turn-on signal to n-p-n input transistor Q5 which turns on. Current then flows from the anode of battery BATT through resistances R3 and R4 and the collector-emitter path of Q5 to ground. The flow of current through R3 develops a voltage which forward biases the base-emitter junction of shunt-removing transistor Q4 and turns it on. When Q4 conducts, it drains the forward bias away from shunting transistor Q3 which turns off to remove the short circuit from across capacitor C1 and permits it to assume a charge.

When turn-on transistor Q5 conducts, current also flows from the anode of battery BATT in series through resistances R9 and R10 connected across the base-emitter junctions of Q1B and Q1A respectively, resistor PTCR, resistance R6 and the collector-emitter path of transistor Q5 to ground. The voltage drop across R9 and R10 due to the flow of current therethrough forward biases the base-emitter junctions of Q1A and Q1B and turns on power transistor Q1 to energize coil SOL and thereby actuate the solenoid.

Base-drive-removing transistor Q2 cannot turn on until capacitor C1 charges up to a predetermined base-emitter voltage. Capacitor C1 charges through resistance R8 but it cannot charge as long as power transistor Q1 is saturated and its $V_{CE}$ voltage is low.

If personnel testing the combine should accidently touch a metallic tool across the terminals of solenoid coil SOL and short it, or if a loose wire should cause such short circuit, a very high current would flow through the emitter-collector junction of power transistor Q1 which may cause it to come out of saturation. Such a fault in prior art apparatus often resulted in desaturation of the power transistor switch and sufficiently high $V_{CE}$ voltage to cause its thermal destruction, and it was then necessary to replace the failed transistor in such prior art apparatus before the equipment could again be used.

Such condition of a shorted solenoid coil SOL will cause the voltage across power transistor Q1 to increase and charge capacitor C1 to a potential established by the voltage across Q1 and voltage divider R7, R8. If capacitor C1 charges to a sufficiently high base-emitter voltage (approximately 0.6 volts), base-drive-removing transistor Q2 will turn on. Turning on Q2 will remove base current from power transistor switch Q1, tending to turn it off and thereby increase the voltage drop across Q1. This increases the base drive on Q2, thereby tending to turn it on and eventually removing all base drive from Q1 to prevent its thermal destruction. The protection circuit is now off and remains off until being reset by turning off shunt-removing transistor Q4 to again forward bias and turn on Q3 and thereby short circuit and discharge capacitor C1.

The circuit may be reset by applying logic 1 voltage to both inputs of NAND gate A7 so that it provides a logic 0 output voltage to thereby turn off Q5, Q4, and Q1. When Q4 turns off, Q3 again becomes forward biased and turns on to short circuit and discharge capacitor C1.

When logic 0 voltage is again applied to one input of NAND gate A7 to turn on the power transistor switch Q1, A7 provides logic 1 voltage turn-on signal to input transistor Q5 to turn on transistors Q5 and Q4 and switch power transistor Q1 on.

The circuit also provides overtemperature protection for power transistor switch Q1. Positive temperature coefficient resistor PTCR is mechanically attached to Q1 and will increase in resistance very rapidly at a predetermined temperature. Resistor PTCR is in series with the base of power transistor Q1. If the temperature of Q1 increases due to flow of excessive current therethrough, the resistance of resistor PTCR increases and reduces the base current to Q1. Eventually the base drive to Q1 will be too low to hold Q1 on, and the voltage across Q1 will rise, thereby charging capacitor C1 and turning on shunting transistor Q2 to remove all base drive from power transistor Q1 and turning it off. The circuit is again reset by applying logic 1 signals to both inputs of gate A7 to thereby turn off transistors Q5 and Q4 to discharge capacitor C1 and allow the heat sink of Q1 to cool, and power transistor Q1 may then be switched on by applying a logic 0 signal to one input of NAND gate A7 to thereby apply a logic 1 voltage turn-on signal to transistor Q5.

The embodiments of the invention in which an exclusive property or privilege is claimed are defined as follows:

1. A protective circuit for a power transistor (Q1) adapted to switch a load (SOL) comprising, in combination, a base-drive-removing transistor (Q2) connected in shunt to the base-emitter junction of said power transistor (Q1), an RC circuit including a capacitor (C1) connected in series with a resistance (R8) across the collector-emitter junction of said power transistor (Q1) with said capacitor (C1) in shunt to the base-emitter junction of said base-drive-removing transistor (Q2), a forward-biased shunting transistor (Q3) connected across said capacitor (C1), and switch turn-on transistor means (Q5, Q4) triggerable to the conductive state by a turn-on signal for removing forward bias from said shunting transistor (Q3) to permit said capacitor (C1) to charge and for applying base drive to said power transistor (Q1) to switch it on and thereby energize said load, whereby said capacitor (C1) can charge from excessive voltage across said power transistor (Q1) and turn on said base-drive-removing transistor (Q2) to thereby remove base current from said power transistor and turn it off.

2. A protective circuit for a power transistor in accordance with claim 1 wherein said switch turn-on means includes a shunt-removing transistor (Q4) connected across the base-emitter junction of said shunting transistor (Q3).

3. A protective circuit for a power transistor in accordance with claim 2 wherein said switch turn-on means also includes a turn-on transistor (Q5) having its collector coupled through first (R4) and second (R6) resistances to the bases of said shunt-removing transistor (Q4) and said power transistor (Q1) respectively.

4. A protective circuit for a power transistor (Q1) adapted to switch a load (SOL) comprising, in combination,
    a base-drive-removing transistor (Q2) in shunt to the base-emitter junction of said power transistor (Q1),
    an RC circuit including a capacitor (C1) connected in series with a resistance (R8) across the collector-emitter junction of said power transistor (Q1) with said capacitor (C1) in shunt to the base-emitter junction of said base-drive-removing transistor (Q2),
    a forward biased shunting transistor (Q3) connected across said capacitor (C1),
    a shunt-removing transistor (Q4) connected across the base-emitter junction of said shunting transistor (Q3), and
    switch turn-on transistor means (Q5) triggerable by a turn-on signal to the conductive state for turning on said shunt-removing transistor (Q4) and for forward biasing said base-emitter junction of said power transistor (Q1) to switch it on and energize said load (SOL), whereby said capacitor (C1) can charge from excessive voltage across said power transistor (Q1) to turn on said base-drive-removing transistor (Q2) to thereby remove base current from and prevent thermal destruction of said power transistor (Q1).

5. A protective circuit for a power transistor in accordance with claim 1, 2, 3 or 4 and including a positive temperature coefficient resistor (PTCR) attached to and connected in series with the base of said power transistor, whereby the resistance of said positive temperature coefficient resistor increases rapidly when said power transistor reaches a predetermined temperature and removes base drive from said power transistor to thereby increase the voltage on said capacitor tending to turn on said base-drive-removing transistor.

6. An overcurrent and overtemperature protective circuit for a power transistor (Q1) adapted to switch a load (SOL) comprising, in combination,
    a base-drive-removing transistor (Q2) connected in shunt to the base-emitter circuit of said power transistor (Q1);
    an RC circuit including a capacitor (C1) connected in series with a first resistance (R8) across the collector-emitter junction of said power transistor (Q1) with said capacitor (C1) in shunt to the base-emitter junction of said base-drive-removing transistor (Q2), a second resistance (R7) coupled across said capacitor (C1) and together with said first resistance (R8) forming a voltage divider across said power transistor (Q1),
    a forward-biased shunting transistor (Q3) connected across said capacitor (C1),
    a shunt-removing transistor (Q4) connected across the base-emitter junction of said shunting transistor (Q3), and
    switch transistor turn-on means including a turn-on transistor (Q5) triggerable to a conductive state by a turn-on signal for turning on said shunt-removing transistor (Q4) and for applying base drive to said power transistor (Q1), the collector of said turn-on transistor (Q5) being coupled to the base of said power transistor (Q1) through a positive temperature coefficient reactor (PTCR) in heat exchange relation with said power transistor (Q1), whereby the resistance of said positive temperature coefficient resistor (PTCR) increases rapidly when the temperature of said power transistor reaches a predetermined magnitude and decreases base drive to said power transistor and increases the voltage on said capacitor.

7. A protective circuit in accordance with claim 6 wherein said means for turning on said shunt-removing transistor (Q4) includes a resistance coupled across the base-emitter junction of said shunt-removing transistor (Q4) and having one side coupled to the collector of said turn-on transistor (Q5) and the other side coupled to a unidirectional source of power (BATT).

8. A protective circuit in accordance with claim 6 or 7 which is reset by removal of said turn-on signal to thereby turn off said shunt-removing (Q4) and turn-on (Q5) transistors so that said shunting transistor (Q3) conducts and discharges said capacitor (C1).

* * * * *

UNITED STATES PATENT OFFICE
CERTIFICATE OF CORRECTION

Patent No. 4,360,852   Dated November 23, 1982

Inventor(s) Thomas P. Gilmore

It is certified that error appears in the above-identified patent and that said Letters Patent are hereby corrected as shown below:

In the title on the cover sheet and in column 1, line 4, "System" should read --- Switch ---.

Signed and Sealed this

First Day of March 1983

[SEAL]

Attest:

Attesting Officer

GERALD J. MOSSINGHOFF

Commissioner of Patents and Trademarks